(12) United States Patent
Shiratsuchi et al.

(10) Patent No.: US 12,354,831 B2
(45) Date of Patent: Jul. 8, 2025

(54) PATTERN INSPECTION APPARATUS AND PATTERN INSPECTION METHOD

(71) Applicant: NuFlare Technology, Inc., Yokohama (JP)

(72) Inventors: Masataka Shiratsuchi, Yokohama (JP); Chosaku Noda, Yokohama (JP); Tadayuki Sugimori, Setagaya-ku (JP)

(73) Assignee: NuFlare Technology, Inc., Yokohama (JP)

( * ) Notice: Subject to any disclaimer, the term of this patent is extended or adjusted under 35 U.S.C. 154(b) by 451 days.

(21) Appl. No.: 18/051,196

(22) Filed: Oct. 31, 2022

(65) Prior Publication Data

US 2023/0088951 A1 Mar. 23, 2023

Related U.S. Application Data

(63) Continuation of application No. PCT/JP2021/011925, filed on Mar. 23, 2021.

(30) Foreign Application Priority Data

May 22, 2020 (JP) .................................. 2020-089567

(51) Int. Cl.
 *H01J 37/22* (2006.01)
 *H01J 37/147* (2006.01)
 *H01J 37/28* (2006.01)

(52) U.S. Cl.
 CPC .......... *H01J 37/222* (2013.01); *H01J 37/147* (2013.01); *H01J 37/28* (2013.01); *H01J 2237/2803* (2013.01)

(58) Field of Classification Search
 CPC .......... H01J 37/00; H01J 37/02; H01J 37/222; H01J 37/147; H01J 37/26; H01J 37/28;
 (Continued)

(56) References Cited

U.S. PATENT DOCUMENTS 6,067,164 A * 5/2000 Onoguchi ............... H01J 37/28
 250/311
10,281,415 B2 5/2019 Inoue et al.
(Continued)

FOREIGN PATENT DOCUMENTS

JP 2008-177064 A 7/2008
JP 2017-83301 A 5/2017
(Continued)

OTHER PUBLICATIONS

International Search Report issued Jun. 8, 2021 in PCT/JP2021/011925 filed Mar. 23, 2021, 2 pages.
(Continued)

*Primary Examiner* — Jason L McCormack
(74) *Attorney, Agent, or Firm* — Oblon, McClelland, Maier & Neustadt, L.L.P.

(57) ABSTRACT

A pattern inspection apparatus includes a secondary electron image acquisition mechanism to include a deflector deflecting multiple primary electron beams and a detector detecting multiple secondary electron beams, and acquire a secondary electron image corresponding to each of the multiple primary electron beams by scanning a target object with a pattern thereon with the multiple primary electron beams by the deflector, and detecting the multiple secondary electron beams from the target object by the detector, a storage device to store individual correction kernels each generated for individually adjusting a secondary electron image corresponding to each primary electron beam concerning a reference pattern to be commensurate with a reference blurred image, and a correction circuit to correct, by correspondingly using the individual correction kernel, the secondary electron image corresponding to each primary electron beam acquired from the inspection target object.

10 Claims, 16 Drawing Sheets

(58) Field of Classification Search
CPC .............. H01J 37/21; H01J 2237/2803; H01J 2237/0453; H01J 2237/216; H01J 2237/2817; G01N 23/2251
USPC ......................................... 250/306, 307, 311
See application file for complete search history.

(56) References Cited

U.S. PATENT DOCUMENTS

| | | | |
|---|---|---|---|
| 10,984,978 | B2 | 4/2021 | Inoue et al. |
| 11,101,103 | B2 | 8/2021 | Shiratsuchi et al. |
| 2008/0251719 | A1 | 10/2008 | Nakahira et al. |
| 2016/0180190 | A1* | 6/2016 | Lifshin .................. H01J 37/28 382/201 |
| 2019/0362928 | A1 | 11/2019 | Inoue et al. |
| 2020/0126751 | A1 | 4/2020 | Kemen et al. |
| 2020/0286709 | A1* | 9/2020 | Shiratsuchi ............. H01J 37/22 |
| 2021/0125806 | A1 | 4/2021 | Hamada et al. |

FOREIGN PATENT DOCUMENTS

| | | |
|---|---|---|
| JP | 2019-204694 A | 11/2019 |
| JP | 2020-87507 A | 6/2020 |
| JP | 2020-144010 A | 9/2020 |
| KR | 10-2019-0132457 A | 11/2019 |
| WO | WO 2019/021536 A1 | 1/2019 |

OTHER PUBLICATIONS

Taiwanese Office Action issued on Jun. 15, 2022 in Taiwanese Application No. 110112807 filed on Apr. 8, 2021 (with machine generated English Translation), 8 pages.
English translation of International Preliminary Report on Patentability and Written Opinion issued Dec. 1, 2022 in PCT/JP2021/011925, 6 pages.
Office Action issued Jun. 4, 2024, in corresponding Japanese Patent Application No. 2020-089567 (with English Translation), 6 pages.

* cited by examiner

FIG.10A
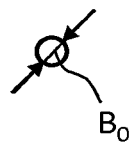
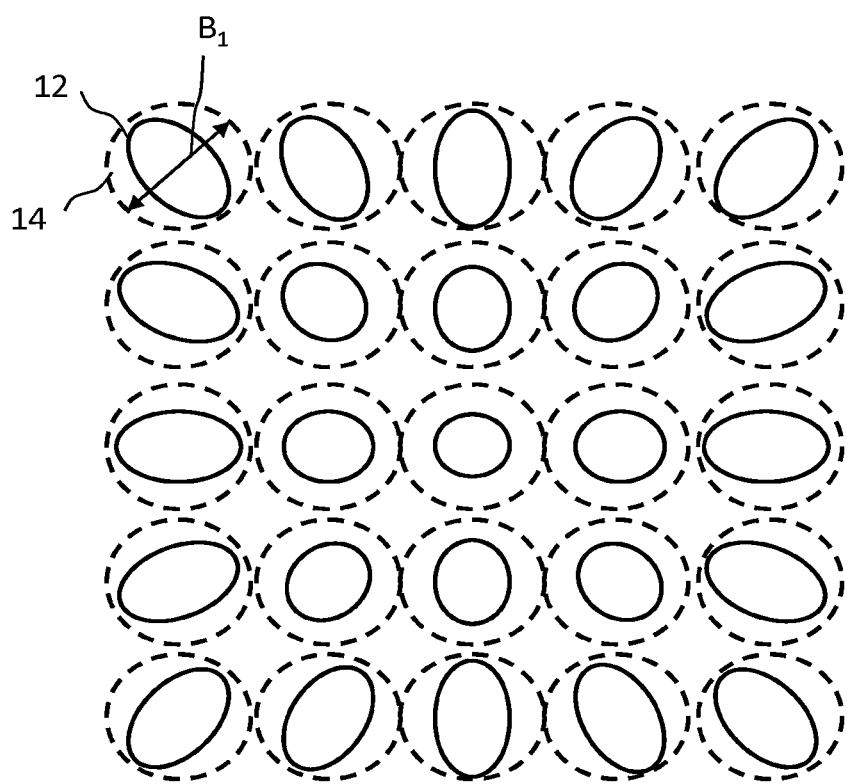
FIG.10B $$K(x,y) = \begin{pmatrix} a_{1,1} & a_{2,1} & a_{31,1} \\ a_{1,2} & & \\ \vdots & & \\ a_{1,31} & & a_{31,31} \end{pmatrix}$$

PATTERN INSPECTION APPARATUS AND PATTERN INSPECTION METHOD

CROSS-REFERENCE TO RELATED APPLICATION

This application is a continuation application based upon and claims the benefit of priority from prior Japanese Patent Application No. 2020-089567 (application number) filed on May 22, 2020 in Japan, and International Application PCT/JP2021/011925, the international filing date of which is Mar. 23, 2021. The contents described in JP2020-089567 and PCT/JP2021/011925 are incorporated herein by reference.

BACKGROUND OF THE INVENTION

Field of the Invention

Embodiments of the present invention relate to a pattern inspection apparatus and a pattern inspection method. For example, embodiments of the present invention relate to a method for inspecting an image of a figure pattern acquired using multiple electron beams.

Description of Related Art

In recent years, with high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as typified by a CPU (central processing unit) chip with more than one billion transistors or a NAND flash memory with a line width of less than 10 nm, the size of patterns that make up the LSI is reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on a mask for exposing/transferring an ultrafine pattern onto the semiconductor wafer by the photolithography technology. Therefore, the pattern inspection apparatus for inspecting defects on an exposure transfer mask used in manufacturing LSI also needs to be highly accurate.

The inspection apparatus acquires a pattern image by, for example, irradiating an inspection target substrate with multiple electron beams and detecting a secondary electron corresponding to each beam emitted from the inspection target substrate. As an inspection method, there is known a method of comparing a measured image acquired by imaging a pattern formed on a substrate with design data or with another measured image acquired by imaging an identical pattern on the same substrate. For example, as a pattern inspection method, there is "die-to-die inspection" or "die-to-database inspection". Specifically, the "die-to-die inspection" method compares data of measured images acquired by imaging identical patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

With respect to a multiple electron beam inspection apparatus, each beam should be uniform because a minute difference between observation objects needs to be detected. However, in real multiple beams, it is difficult to completely eliminate a difference of shape or size between beams. If there is a shape or size difference between beams, a difference depending on beam characteristics occurs between images acquired with different beams. Therefore, a precise inspection may not be performed when comparing inspection images acquired with different beams, which results in a serious problem for realizing the inspection apparatus.

There is disclosed a technique in which after individually correcting distortion of an image of a region to be scanned by each of multiple beams, region images to be scanned by circumferential beams are connected to perform further correction of distortion, and an inspection image obtained by connecting the region images is compared with a reference image (e.g., refer to Japanese Patent Application Laid-open (JP-A) No. 2017-083301). This technique is for correcting distortion between beams in one inspection image so as to use an image obtained by connecting images by a plurality of beams, as an inspection image.

BRIEF SUMMARY OF THE INVENTION

According to one aspect of the present invention, a pattern inspection apparatus includes
  a secondary electron image acquisition mechanism configured to include a deflector which deflects multiple primary electron beams and a detector which detects multiple secondary electron beams, and to acquire a secondary electron image corresponding to each primary electron beam of the multiple primary electron beams by scanning a surface of a target object, on which a pattern has been formed, with the multiple primary electron beams by using the deflector, and detecting the multiple secondary electron beams emitted from the surface of the target object by using the detector;
  a storage device configured to store individual correction kernels each of which is generated for individually adjusting a secondary electron image corresponding to the each primary electron beam with respect to a reference pattern to be commensurate with a reference blurred image;
  a correction circuit configured to correct, by correspondingly using the individual correction kernel, the secondary electron image corresponding to the each primary electron beam acquired from the target object to be inspected; and
  a comparison circuit configured to compare an inspection image configured by at least a portion of the secondary electron image having been corrected and a reference image.

According to another aspect of the present invention, a pattern inspection method includes
  acquiring a secondary electron image corresponding to each primary electron beam of multiple primary electron beams by scanning a surface of a target object, on which a pattern has been formed, with the multiple primary electron beams, and detecting multiple secondary electron beams emitted from the surface of target object;

correcting the secondary electron image corresponding to the each primary electron beam acquired from the target object to be inspected, by reading from a storage device an individual correction kernel, which correspondingly adjusts each secondary electron image corresponding to the each primary electron beam with respect to a reference pattern to be commensurate with a reference blurred image, to perform the correcting by correspondingly using the individual correction kernel; and comparing an inspection image configured by at least a portion of the secondary electron image having been corrected and a reference image so as to output a compared result.

BRIEF DESCRIPTION OF THE DRAWINGS

FIGS. 10A and 10B are illustrations of an example of a beam diameter of a reference primary electron beam and the maximum beam diameter at a shifted position where the maximum of σ value of each primary electron beam becomes the minimum according to the first embodiment;

DETAILED DESCRIPTION OF THE INVENTION

Embodiments of the present invention provide an inspection apparatus and method that can adjust inspection images acquired with different beams to be close to images acquired under the same conditions.

First Embodiment

Figure 1:
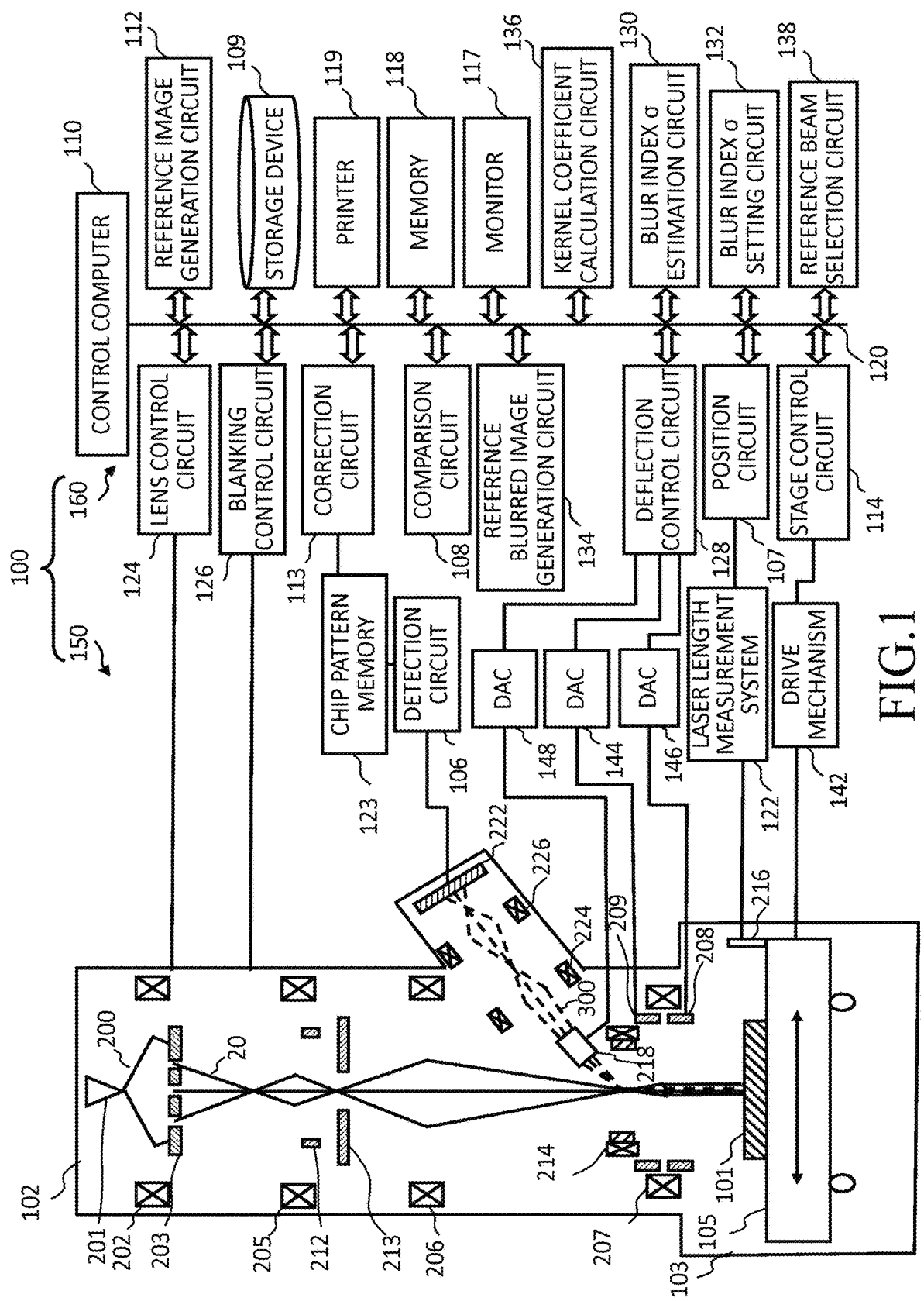
FIG. 1 is a block diagram showing an example of a configuration of a pattern inspection apparatus according to a first embodiment.

FIG. 1 is a block diagram showing an example of a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 (secondary electron image acquisition mechanism) and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a collective blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, an electromagnetic lens 226, and a multi-detector 222.

A stage 105 movable at least in the x, y, and z directions is disposed in the inspection chamber 103. A substrate 101 (target object) to be inspected is mounted on the stage 105. The substrate 101 may be an exposure mask substrate, or a semiconductor substrate such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is mainly described below. The substrate 101 is placed, with its pattern-forming surface facing upward, on the stage 105, for example. Further, on the stage 105, there is disposed a mirror 216 which reflects a laser beam for measuring a laser length emitted from the laser length measurement system 122 disposed outside the inspection chamber 103. The multi-detector 222 is connected, at the outside of the electron beam column 102, to the detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a correction circuit 113, a stage control circuit 114, a lens control circuit 124, a blanking control circuit 126, a deflection control circuit 128, a blur index σ estimation circuit 130, a blur index σ setting circuit 132, a reference blurred image generation circuit 134, a kernel coefficient calculation circuit 136, a reference beam selection circuit 138, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The chip pattern memory 123 is connected to the correction circuit 113. The stage 105 is driven by the drive mechanism 142 under the control of the stage control circuit 114. In the drive mechanism 142, a drive system such as a three (x-, y-, and θ-) axis motor which provides drive in the directions of x, y, and θ in the stage coordinate system is configured, and therefore, the stage 105 can be moved in the x, y, and θ directions. A step motor, for example, can be used as each of these x, y, and θ motors (not shown). The stage 105 is movable in the horizontal direction and the rotation direction by the X-, Y-, and θ-axis motors. The movement position of the stage 105 is measured by the laser length measurement system 122, and supplied (transmitted) to the position circuit 107. Based on the principle of laser interferometry, the laser length measurement system 122 measures the position of the stage 105 by receiving a reflected light from the mirror 216. In the stage coordinate system, the x, y, and θ directions are set, for example, with respect to a plane perpendicular to the optical axis (center axis of electron trajectory) of the multiple primary electron beams.

The electromagnetic lenses 202, 205, 206, 207 (objective lens), 224 and 226, and the beam separator 214 are controlled by the lens control circuit 124. The collective blanking deflector 212 is composed of two or more electrodes (or poles), and each electrode is controlled by the blanking control circuit 126 through a DAC amplifier (not shown). The sub deflector 209 is composed of four or more electrodes (or poles), and each electrode is controlled by the deflection control circuit 128 through the DAC amplifier 144. The main deflector 208 is composed of four or more electrodes (or poles), and each electrode is controlled by the deflection control circuit 128 through the DAC amplifier 146. The deflector 218 is composed of four or more electrodes (or poles), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
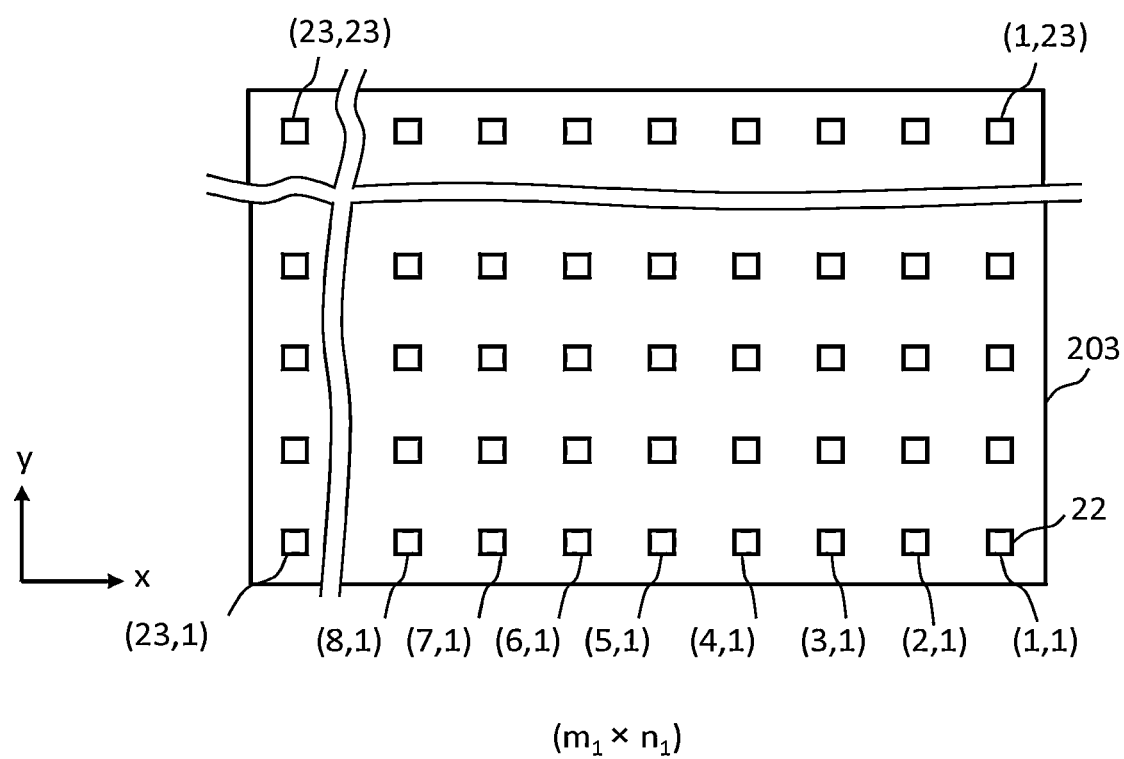
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ rows long (length in the y direction) (each row in the x direction) and $n_1$ columns wide (width in the x direction) (each column in the y direction) are two-dimensionally formed at a predetermined arrangement pitch in the shaping aperture array substrate 203, where $m_1$ and $n_1$ are integers of 2 or more. In the case of FIG. 2, holes 22 of 23×23 are formed. Ideally, each of the holes 22 is a rectangle (including a square) having the same dimension, shape, and size. Alternatively, ideally, each of the holes 22 may be a circle with the same outer diameter. Multiple primary electron beams 20 are formed by letting portions of the electron beam 200 individually pass through a corresponding one of a plurality of holes 22. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where the holes are arranged like a grid in the width and length directions. For example, with respect to the x-direction kth and (k+1)th rows which are arrayed in the length direction (in the y direction), each hole in the kth row and each hole in the (k+1)th row may be arranged mutually displaced in the width direction (in the x direction) by a dimension "a". Similarly, with respect to the x-direction (k+1)th and (k+2)th rows which are arrayed in the length direction (in the y direction), each hole in the (k+1)th row and each hole in the (k+2)th row may be arranged mutually displaced in the width direction (in the x direction) by a dimension "b".

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all of the plurality of holes 22 is irradiated by the electron beam 200. The multiple primary electron beams 20 are formed by letting portions of the electron beam 200 applied to the positions of a plurality of holes 22 individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens), while repeating forming an intermediate image and a crossover, passing through the beam separator 214 disposed at the intermediate image plane position of each beam of the multiple primary electron beams 20. Then, the electromagnetic lens 207 focuses the multiple primary electron beams 20 onto the substrate 101. The multiple primary electron beams 20 having been focused on the substrate 101 (target object) by the objective lens 207 are collectively deflected by the main deflector 208 and the sub deflector 209 to irradiate respective beam irradiation positions on the substrate 101. When all of the multiple primary electron beams 20 are collectively deflected by the collective blanking deflector 212, they deviate from the hole in the center of the limiting aperture substrate 213 and are blocked by the limiting aperture substrate 213. By contrast, the multiple primary electron beams 20 which were not deflected by the collective blanking deflector 212 pass through the hole in the center of the limiting aperture substrate 213 as shown in FIG. 1. Blanking control is provided by On/Off of the collective blanking deflector 212, and thus On/Off of the multiple beams is collectively controlled. Thus, the limiting aperture substrate 213 blocks the multiple primary electron beams 20 which were deflected to be in the "Off condition"

by the collective blanking deflector 212. Then, the multiple primary electron beams 20 for inspection (for image acquisition) are formed by the beams having been made during a period from becoming "beam On" to becoming "beam Off" and having passed through the limiting aperture substrate 213.

When desired positions on the substrate 101 are irradiated with the multiple primary electron beams 20, reflected electrons and a flux of secondary electrons (multiple secondary electron beams 300) each corresponding to each of the multiple primary electron beams 20 are emitted from the substrate 101 due to the irradiation with the multiple primary electron beams 20.

The multiple secondary electron beams 300 emitted from the substrate 101 travel to the beam separator 214 through the electromagnetic lens 207.

The beam separator 214 (E×B separator) includes a plurality of, at least two, magnetic poles each having a coil, and a plurality of, at least two, electrodes (poles). A directive magnetic field is generated by these plurality of magnetic poles. Similarly, a directive electric field is generated by these plurality of electrodes. Specifically, the beam separator 214, also called a Wien filter, generates an electric field and a magnetic field to be perpendicular to each other in a plane orthogonal to the traveling direction of the center beam (electron trajectory center axis) of the multiple primary electron beams 20. The electric field exerts a force in a fixed direction regardless of the traveling direction of electrons. In contrast, the magnetic field exerts a force according to Fleming's left-hand rule. Therefore, the direction of the force acting on electrons can be changed depending on the entering (or "traveling") direction of electrons. With respect to the multiple primary electron beams 20 entering the beam separator 214 from above, since the forces due to the electric field and the magnetic field cancel each other out, the beams 20 travel straight downward. In contrast, with respect to the multiple secondary electron beams 300 entering the beam separator 214 from below, since both the forces due to the electric field and the magnetic field are exerted in the same direction, the beams 300 are bent obliquely upward, and separated from the multiple primary electron beams 20.

The multiple secondary electron beams 300 having been bent obliquely upward and separated from the multiple primary electron beams 20 are further bent by the deflector 218, and projected onto the multi-detector 222 while being refracted by the electromagnetic lenses 224 and 226. The multi-detector 222 detects the projected multiple secondary electron beams 300. Reflected electrons and secondary electrons may be projected on the multi-detector 222, or it is also acceptable that reflected electrons are emitted along the way and remaining secondary electrons are projected. The multi-detector 222 includes a two-dimensional sensor (not shown), for example. Then, each secondary electron of the multiple secondary electron beams 300 collides with a corresponding region of the two-dimensional sensor, thereby generating electrons, and secondary electron image data is generated in each sensor. In other words, in the multi-detector 222, a detection sensor is disposed for each primary electron beam 20i of the multiple primary electron beams 20, where i indicates an index, and i=1 to 529 in the case of the multiple primary electron beams 20 being composed of 23×23 beams. Then, the detection sensor detects a corresponding secondary electron beam emitted by irradiation with each primary electron beam 20i. Therefore, each of a plurality of detection sensors in the multi-detector 222 detects an intensity signal of a secondary electron beam for an image, which is resulting from irradiation with a corresponding primary electron beam 20i. The intensity signal detected by the multi-detector 222 is output to the detection circuit 106.

Figure 3:
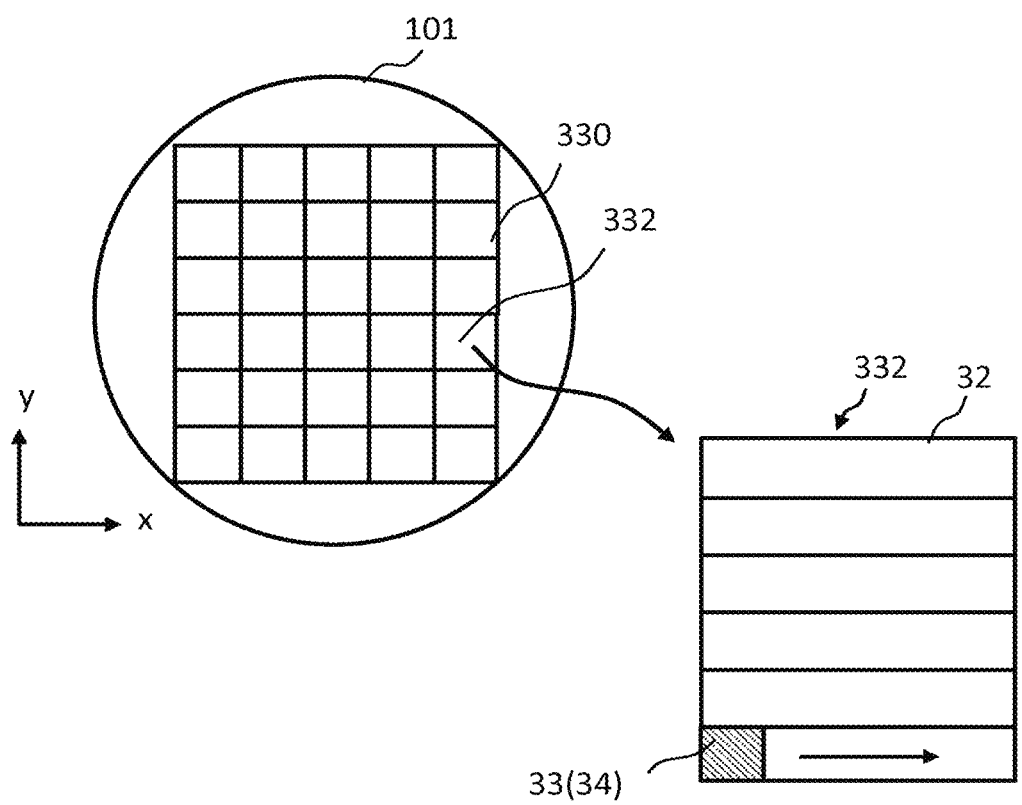
FIG. 3 is an example of a plurality of chip regions formed on a semiconductor substrate, according to the first embodiment.

FIG. 3 is an example of a plurality of chip regions formed on a semiconductor substrate, according to the first embodiment. In FIG. 3, in the case of the substrate 101 being a semiconductor substrate (wafer), a plurality of chips (wafer dies) 332 are formed in a two-dimensional array in an inspection region 330 of the semiconductor substrate (wafer). With respect to each chip 332, a mask pattern for one chip formed on an exposure mask substrate is reduced to, for example, ¼, and exposed/transferred onto each chip 332 by an exposure device (stepper) (not shown). The region of each chip 332 is divided into a plurality of stripe regions 32 by a predetermined width being in the y direction, for example. The scanning operation by the image acquisition mechanism 150 is carried out for each stripe region 32, for example. Each stripe region 32 is divided into a plurality of unit blocks 33 in the longitudinal direction. Beam application to the unit block 33 concerned is achieved by collectively deflecting all of the multiple beams 20 by the main deflector 208.

Figure 4:
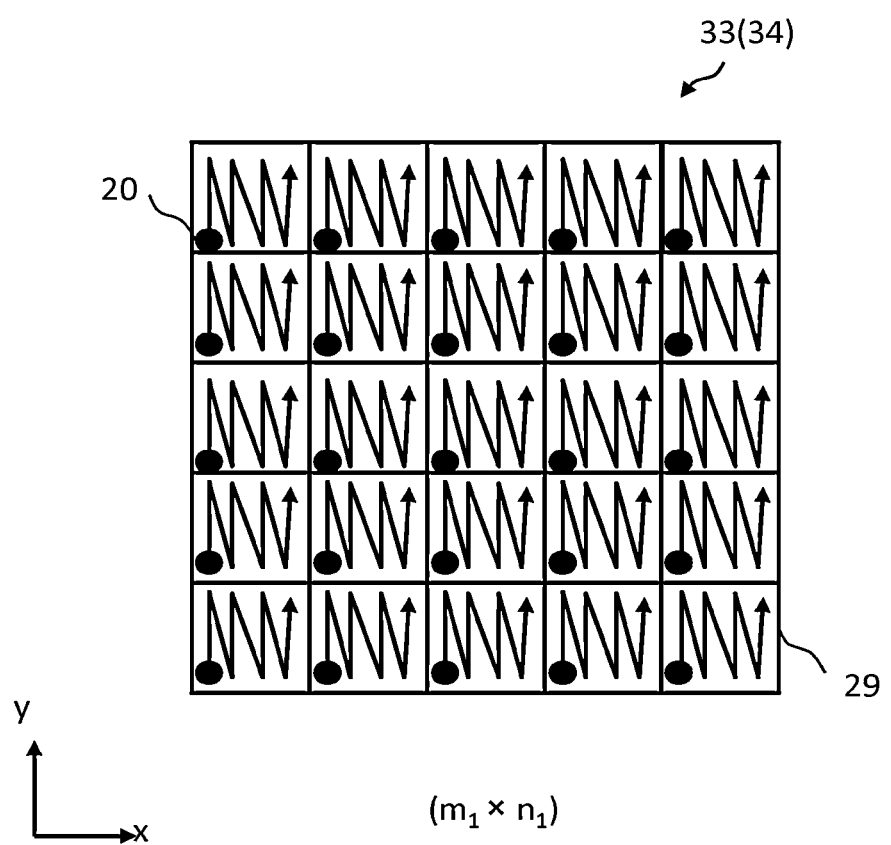
FIG. 4 is an illustration of a scanning operation with multiple beams according to the first embodiment.

FIG. 4 illustrates a scanning operation with multiple beams according to the first embodiment. FIG. 4 shows the case of multiple primary electron beams 20 of 5 rows by 5 columns. The size of an irradiation region 34 that can be irradiated by one irradiation with the multiple primary electron beams 20 is defined by (the x-direction size obtained by multiplying the x-direction beam pitch of the multiple primary electron beams 20 on the substrate 101 by the number of x-direction beams)×(the y-direction size obtained by multiplying the y-direction beam pitch of the multiple primary electron beams 20 on the substrate 101 by the number of y-direction beams). Preferably, the width of each stripe region 32 is set to be the same as the size in the y direction of the irradiation region 34, or to be the size reduced by the width of the scanning margin. In the case of FIGS. 3 and 4, the irradiation region 34 and the unit block 33 are of the same size. However, it is not limited thereto. The irradiation region 34 may be smaller than the unit block 33, or larger than it. A sub-irradiation region 29, which is surrounded by the X-direction beam pitch and the Y-direction beam pitch and in which the beam concerned itself is located, is scanned with each beam of the multiple primary electron beams 20. Each beam of the multiple primary electron beams 20 is associated with any one of the sub-irradiation regions 29 which are different from each other. At the time of each shot, each beam is applied to the same position in the associated sub-irradiation region 29. The beam is moved in the sub-irradiation region 29 by collective deflection of all of the multiple primary electron beams 20 by the sub deflector 209. By repeating this operation, one sub-irradiation region 29 is irradiated with one beam, in order. Then, when scanning of one sub-irradiation region 29 is completed, the irradiation position is moved to an adjacent unit block 33 in the same stripe region 32 by collectively deflecting all of the multiple primary electron beams 20 by the main deflector 208. By repeating this operation, the inside of the stripe region 32 is irradiated in order. After completing scanning of one stripe region 32, the irradiation position is moved to the next stripe region 32 by moving the stage 105 and/or by collectively deflecting all of the multiple primary electron beams 20 by the main deflector 208. As described above, a secondary electron image of the unit block 33, a secondary electron image of the stripe region 32, or a secondary electron image of the chip 332 is configured by combining images (partial secondary electron images) each of which is an image of the sub-irradiation region 29 acquired by irradiation with each corresponding primary electron beam of the multiple primary electron beams 20.

It is also preferable to group, for example, a plurality of chips 332 arranged in the x direction as the same group, and to divide each group into a plurality of stripe regions 32 by a predetermined width in the y direction, for example. Then, moving between stripe regions 32 is not limited to moving in each chip 332, and it is also preferable to move in each group.

In the case of the substrate 101 being irradiated with the multiple primary electron beams 20 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, in the case of scanning the sub-irradiation region 29, the emission position of each secondary electron beam changes every second inside the sub-irradiation region 29. The deflector 218 collectively deflects the multiple secondary electron beams 300 so that each secondary electron beam whose emission position has changed may be applied to a corresponding detection region of the multi-detector 222.

Ideally, it is desirable for the shape and size of each primary electron beam of the multiple primary electron beams 20 to be uniform on the substrate 101. However, actually, it is difficult to form uniform beams due to a manufacturing error of each hole 22 of the shaping aperture array substrate 203 and/or an aberration, etc. of the optical system. For example, with respect to the multiple primary electron beams 20, in proportion as the beam concerned is far from the center, its shape becomes flat and elliptical and length of the long diameter increases compared to the center beam. Further, the center beam is not necessarily a true circle. The shape and size of each primary electron beam $20i$ are not limited to what is described above. They may be transformed to be other shape and/or size. Thus, secondary electron images acquired by irradiation with a plurality of primary electron beams having different shape and size, in which the direction on the substrate 101 is also included, are naturally affected by the different beam shape and size. As will be described later, in the first embodiment, secondary electron images acquired by irradiation with different primary electron beams are compared with each other (die-to-die inspection). However, when secondary electron images having been affected by different shape and size of beams are compared, since deviation occurs between the images, they do not become the same as each other, thereby generating false (pseudo) defects. Therefore, it becomes difficult to perform a highly accurate inspection. Alternatively or/and additionally, in the case of comparing a measured image with a reference image generated from design data (die-to-database inspection), since accuracies of secondary electron images based on beams are different, deviation occurs when compared, thereby generating false (pseudo) defects. Therefore, it becomes difficult to perform a highly accurate inspection.

According to the first embodiment, using a reference pattern, a reference blurred image to which a moderate blur has been purposely added is generated. Then, an individual correction kernel for adjusting each secondary electron image acquired by irradiation with each primary electron beam to be commensurate with the reference blurred image is calculated in advance. In an actual inspection, in any case of acquiring an image by any beam, smoothing processing that adjusts each secondary electron image to have a blurring similar to that of a reference blurred image is performed by convolving each secondary electron image acquired by irradiation by each primary electron beam with a corresponding individual correction kernel. It will be specifically described.

Figure 5:
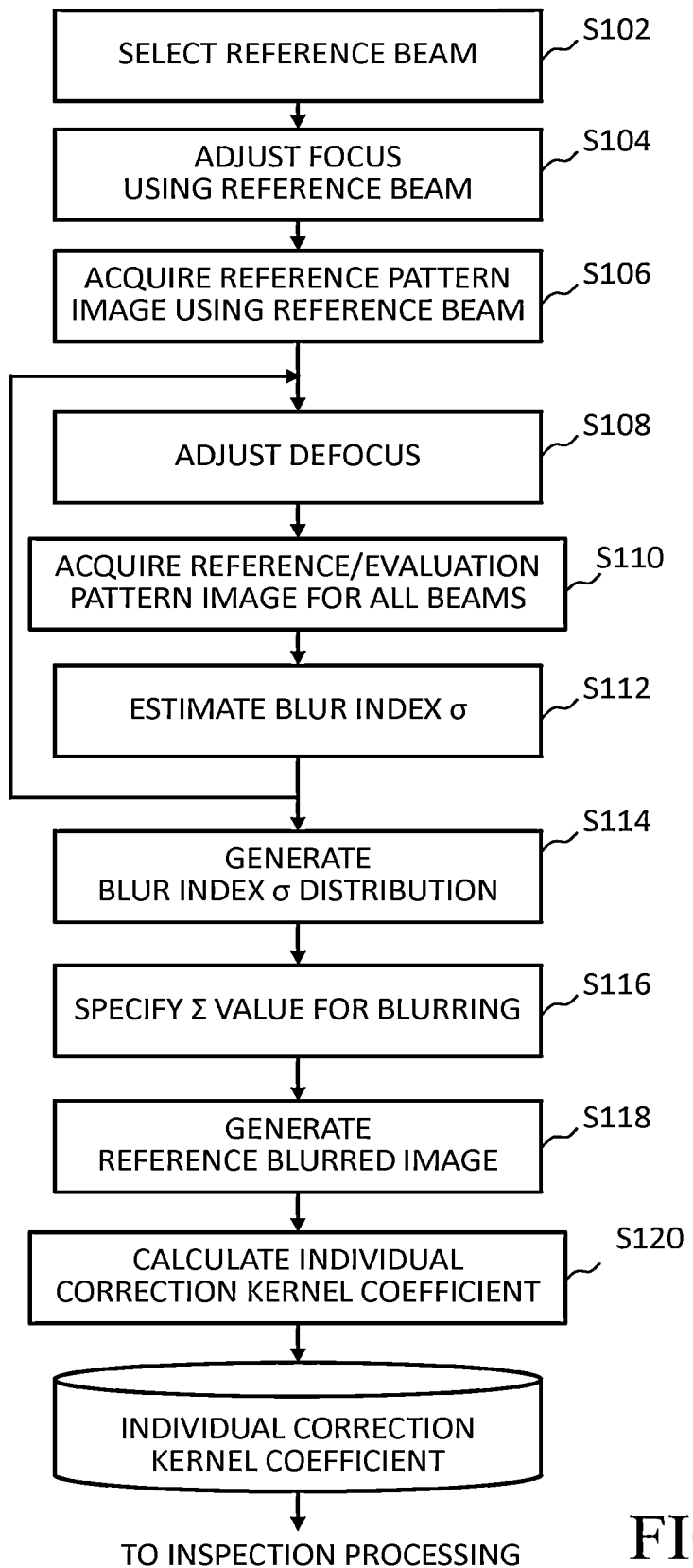
FIG. 5 is a flowchart showing a part of main steps of an inspection method according to the first embodiment.

FIG. 5 is a flowchart showing a part of main steps of an inspection method according to the first embodiment. In FIG. 5, the inspection method of the first embodiment executes a series of steps: a reference beam selection step (S102), a focus adjustment step (S104) using a reference beam, a reference pattern image acquisition step (S106) using a reference beam, a defocus adjustment step (S108), a reference/evaluation pattern image acquisition step (S110) for all beams, a blur index σ estimation step (S112), a blur index σ distribution generation step (S114), a σ-value-for-blurring specification step (S116), a reference blurred image generation step (S118), and an individual correction kernel coefficient calculation step (S120). FIG. 5 shows preprocessing steps of inspection processing.

In the reference beam selection step (S102), the reference beam selection circuit 138 selects a reference primary electron beam to be a reference from the multiple primary electron beams 20. Each of the multiple primary electron beams 20 may have a different focus position, on the surface of the substrate 101, differing from each other due to the influence of an aberration (e.g., image plane distortion aberration) of the optical system. Therefore, it is difficult to obtain a state where all the primary electron beams are just focused in order to acquire an image of a pattern. Then, a primary electron beam just in focus to acquire an image is selected as a reference primary electron beam. For example, a center beam is selected as a reference primary electron beam. However, it is not limited thereto, and another beam may also be selected.

In the focus adjustment step (S104) using a reference beam, the lens control circuit 124 adjusts the electromagnetic lens 207 (objective lens) such that a selected reference primary electron beam is focused on the surface of an evaluation substrate by the electromagnetic lens 207. The evaluation substrate is formed in a manner that its surface is flush to the inspection substrate 101. A reference pattern and a defocus evaluation pattern are arranged on the evaluation substrate. A pattern which is suitable for quantitatively evaluating the blurred condition (the amount of blurring) resulting from a focus deviation (defocus) is used as the defocus evaluation pattern. For example, it is preferable to use a pattern including straight knife edge patterns in various directions. It is preferable to measure the amount of blurring with respect to every direction, and to express the blurring amount by a value obtained by converting the maximum measured blurring amount into a standard deviation value σ of Gaussian distribution. Further, it is preferable to use, as a reference pattern, a circuit pattern configured by line patterns of the minimum line width arranged on the inspection substrate 101. However, it is not limited thereto. A general circuit pattern, such as a complicated circuit pattern including edges in various directions, may also be used. Further, a defocus evaluation pattern may be arranged as a portion of a reference pattern, and a reference pattern may also be used as a defocus evaluation pattern.

Figure 6:
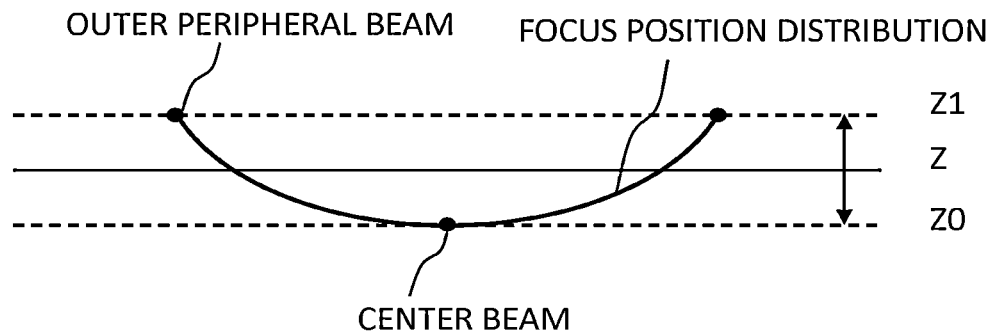
FIG. 6 is an illustration showing an example of a focus position distribution according to the first embodiment.

FIG. 6 is an illustration showing an example of a focus position distribution according to the first embodiment. As shown in FIG. 6, each primary electron beam has a different focus position, on the surface of the substrate 101, differing from each other due to the influence of an aberration (e.g., image plane distortion aberration) of the optical system. Generally, the more outward from the center the beam concerned is, the larger the deviation of the focus position becomes, compared to the center beam. For example, as shown in FIG. 6, it deviates in a manner of an arc (a sphere when viewed in three dimensions). For example, when the center beam is selected as a reference primary electron beam, the focus position of the reference primary electron beam is focused on the height position Z0. For example, when an outer peripheral beam is selected as a reference primary electron beam, the focus position of the reference primary electron beam is focused on the height position Z1. Generally, since the center beam has the smallest aberration, etc., and an isotropic blurred image can be acquired with the center beam, it is preferable to use the center beam as a reference beam for acquiring a reference pattern image.

In the reference pattern image acquisition step (S106) using a reference beam, the image acquisition mechanism 150 scans a reference pattern formed on the evaluation substrate with a reference primary electron beam in the state where the focus position of the reference primary electron beam has been set on the evaluation substrate. Then, by detecting a secondary electron beam emitted from the evaluation substrate by the multi-detector 222, the image acquisition mechanism 150 acquires a secondary electron image of the reference pattern corresponding to the scanning with the reference primary electron beam. The scanning may be performed using all the multiple primary electron beams 20, or performed by blocking beams other than the reference primary electron beam by the shutter (not shown), etc. Thereby, it is possible to acquire an image (reference pattern image) of the reference pattern obtained using the reference primary electron beam in a focused state. The blurred condition of the reference pattern image acquired at this stage is usually less than a fraction of the blurred condition of an image acquired in a general inspection by the image acquisition mechanism 150. Therefore, it is expected that the reference pattern image acquired here is extremely sharp.

In the defocus adjustment step (S108), the lens control circuit 124 adjusts the electromagnetic lens 207 such that the electromagnetic lens 207 shifts (defocuses) the focus position of the reference primary electron beam from the surface of the evaluation substrate by a predetermined shifting amount. For example, as shown in FIG. 6, the focus position is shifted to the height position Z between the height positions Z0 and Z1.

In the reference/evaluation pattern image acquisition step (S110) for all beams, the image acquisition mechanism 150 scans a reference pattern and a defocus evaluation pattern formed on the evaluation substrate with the multiple primary electron beams in the state where the focus position of the reference primary electron beam has been shifted (the reference primary electron beam has been defocused) from the surface of the evaluation substrate. Then, by detecting the multiple secondary electron beams 300 emitted from the evaluation substrate by the multi-detector 222, the image acquisition mechanism 150 acquires secondary electron images of the reference pattern and the defocus evaluation pattern which are corresponding to the scanning with each primary electron beam. Both the images of the reference pattern and the defocus evaluation pattern may be included in the same image, or in separate images individually.

In the blur index $\sigma$ estimation step (S112), the blur index $\sigma$ estimation circuit 130 ($\sigma$ estimation unit) estimates a blur index $\sigma$ (or hereafter described as $\sigma$ value) individually based on secondary electron images of the defocus evaluation pattern of respective primary electron beams, and the secondary electron images of the defocus evaluation pattern of respective primary electron beams are acquired at each of positions obtained by variably shifting the focus position of the reference primary electron beam.

Figure 7:
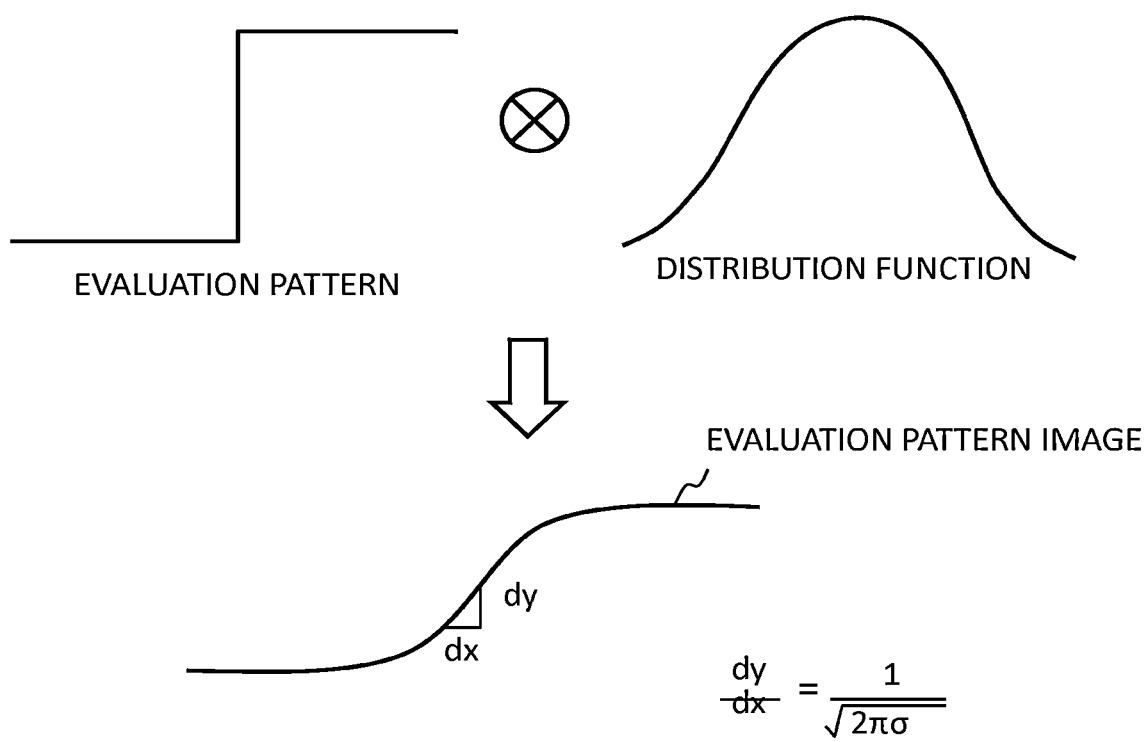
FIG. 7 is an illustration for explaining an example of a method for estimating σ according to the first embodiment.

FIG. 7 is an illustration for explaining an example of a method for estimating the blur index $\sigma$ according to the first embodiment. As shown in FIG. 7, in the case where a knife edge pattern, for example, is used as a defocus evaluation pattern, and the image of the defocus evaluation pattern is acquired by using an electron beam which has a cross-sectional distribution of a Gaussian function shape, the edge portion of the acquired image is a pattern with a gentle rise. At this time, the gradient dx/dy of the rising portion of the defocus evaluation pattern in the acquired image is calculated. As shown in FIG. 7, when the knife edge pattern is convolved with the distribution of the Gaussian function shape, the gradient of the edge portion is $dy/dx=1/(\sqrt{(2\pi)}\sigma)$. Thus, it becomes possible to define, as a blur index, the parameter $\sigma$ of the Gaussian function obtained from the gradient of the edge portion of the defocus evaluation pattern in the acquired image. If knife edge patterns in various directions are included in the defocus evaluation pattern, the maximum $\sigma$ in a plurality of $\sigma$, each obtained for each direction, is defined as the blur index $\sigma$.

Then, returning to the defocus adjustment step (S108), each step from the defocus adjustment step (S108) to the blur index $\sigma$ estimation step (S112) is repeated while variably shifting the focus position. In the case of selecting the center beam as a reference primary electron beam, a plurality of height positions Z may be set, while centering the height position Z0, between a height position lower than the height position Z0 and a height position higher than the height position Z0 in a predetermined range. However, it is not limited thereto. For example, a plurality of height positions Z may be set between the height position Z0 and the height position Z1, or a height position higher than the height position Z1 may be used.

Figure 8:
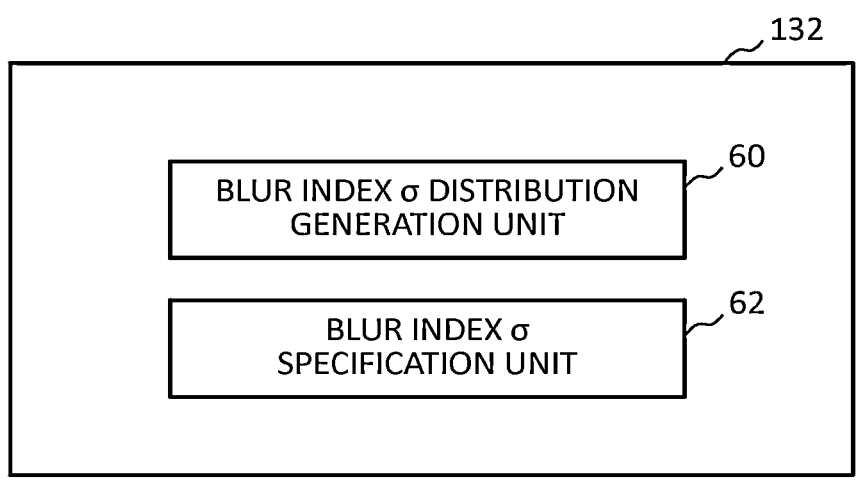
FIG. 8 is a block diagram showing an example of an internal configuration of a σ setting circuit according to the first embodiment.

FIG. 8 is a block diagram showing an example of an internal configuration of a $\sigma$ setting circuit according to the first embodiment. In FIG. 8, a blur index $\sigma$ distribution generation unit 60 and a blur index $\sigma$ specification unit 62 are arranged in the blur index $\sigma$ setting circuit 132. Each of the "units" such as the blur index $\sigma$ distribution generation unit 60 and the blur index $\sigma$ specification unit 62 includes processing circuitry. As the processing circuitry, for example, an electric circuit, computer, processor, circuit board, quantum circuit, semiconductor device, or the like can be used. Further, common processing circuitry (the same processing circuitry), or different processing circuitry (separate processing circuitry) may be used for each of the "units". Input data required in the blur index $\sigma$ distribution generation unit 60 and the blur index $\sigma$ specification unit 62, and calculated results are stored in a memory (not shown) or in the memory 118 each time.

In the blur index $\sigma$ distribution generation step (S114), the blur index $\sigma$ distribution generation unit 60 generates a distribution of a blur index $\sigma$ of each primary electron beam, and the blur index $\sigma$ of the each primary electron beam is estimated at each of positions obtained by shifting the focus position of the reference primary electron beam.

Figure 9:
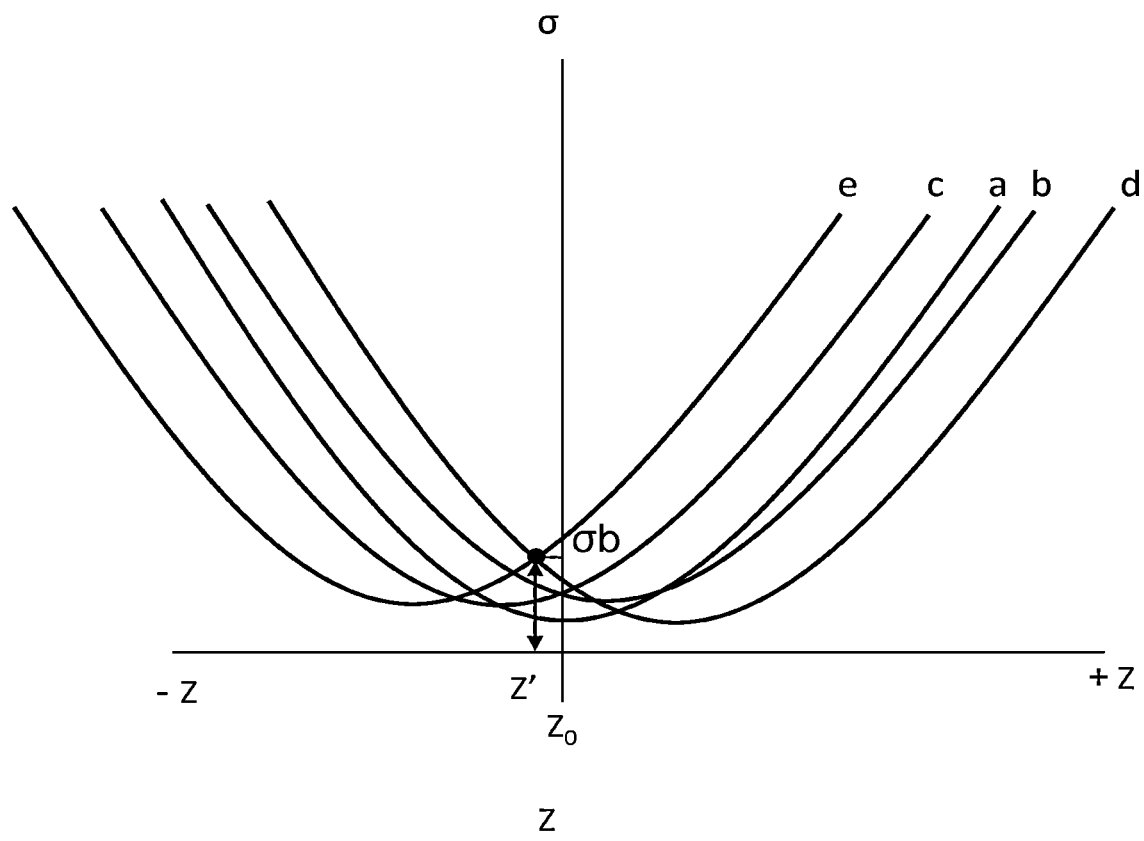
FIG. 9 is a graph showing an example of a σ value distribution according to the first embodiment.

FIG. 9 is a graph showing an example of a blur index $\sigma$ distribution according to the first embodiment. For example, FIG. 9 shows, with respect to each of five primary electron beams a, b, c, d, and e, a blur index $\sigma$ distribution of each beam estimated from a secondary electron image of a defocus evaluation pattern of each primary electron beam acquired at each position Z which is obtained by variably shifting the focus position of the reference primary electron beam. The smaller the σ value is, the less the blur becomes and the shorter the beam diameter becomes. In each primary electron beam, when the focus position is just focused on the surface of the evaluation substrate, the blur becomes less and the σ value becomes small.

In the σ-value-for-blurring specification step (S116), referring to the σ value distribution, the blur index σ specification unit 62 specifies an index value $\sigma_1$ (or hereafter described as $\sigma_1$ value) which is used for blur processing. In other words, the blur index σ specification unit 62 (determination unit) determines $\sigma_1$ used for blurring, based on a blur index σ which is estimated from at least one of secondary electron images of evaluation pattern of respective primary electron beams, where the secondary electron images of the evaluation pattern of the respective primary electron beams are acquired at a position obtained by shifting the focus position of the reference primary electron beam, selected among multiple primary electron beams, from the surface of the target object. According to the first embodiment, σb value used as the basis for obtaining the $\sigma_1$ value used for blurring is estimated from a secondary electron image of the defocus evaluation pattern of the primary electron beam having the maximum beam diameter $B_1$ in secondary electron images of defocus evaluation patterns of respective primary electron beams. The maximum beam diameter $B_1$ changes depending on each position Z obtained by variably shifting the focus position of the reference primary electron beam. Then, referring to a distribution of σ value of each primary electron beam, as shown in FIG. 9, the σ value specification unit 62 determines $\sigma_1$ value roughly based on the maximum of blur indexes σ, that is, the maximum blur index σb of blur indexes σ of the multiple primary electron beams at the shifted position Z' where the maximum of σ value of each primary electron beam at each shifted position becomes the minimum. For example, a value in the range of ±10% of the maximum blur index σb is specified as the $\sigma_1$ value for blurring. Therefore, it is also preferable to specify the maximum blur index σb as the $\sigma_1$ value for blurring. Preferably, the beam diameter of the primary electron beam corresponding to the $\sigma_1$ value for blurring is ½ or less than the size of a defect to be detected. When defining the beam diameter of a primary electron beam by a full width at half maximum of a beam profile, it can be approximated by multiplying $\sigma_1$ value by 2.35(=2√(2ln(2))).

FIGS. 10A and 10B are illustrations of an example of a beam diameter of a reference primary electron beam and the maximum beam diameter at a shifted position where the maximum of σ value of each primary electron beam becomes the minimum according to the first embodiment. FIG. 10A shows a reference primary electron beam. FIG. 10B shows each primary electron beam at a shifted position where the maximum deviation value σb is obtained. FIG. 10B shows the case where the size of the primary electron beam 12 at the outer peripheral part is the maximum. The maximum beam diameter $B_1$ is denoted by the maximum diameter size 14 of the primary electron beam 12. As shown in FIG. 10A, the beam diameter $B_0$ of the reference primary electron beam is small because of being in a just focused state. In contrast to this, at the shifted position Z', as shown in FIG. 10B, since the focus of the primary electron beam 12 at the outer peripheral part is in a defocused state, the size of a blur is added to the original beam diameter, and therefore, the maximum beam diameter $B_1$ of the primary electron beam 12 is large.

In the reference blurred image generation step (S118), the reference blurred image generation circuit 134 generates a reference blurred image by performing blur processing corresponding to $\sigma_1$ for blurring obtained above, for a secondary electron image of the reference pattern, that is a reference pattern image, acquired in the state where the focus position of the reference primary electron beam is focused on the surface of the evaluation substrate.

Meanwhile, a blur is included in the reference pattern image though the amount of blurring is small. Therefore, a reference deviation value $\sigma_0$ (or hereafter described as a reference $\sigma_0$ value), used as a reference, exists also in the reference pattern image. The reference $\sigma_0$ value can be estimated from a secondary electron image acquired by imaging a defocus evaluation pattern in the state where the reference primary electron beam is just focused. To perform, for the reference pattern image, a blur process corresponding to the $\sigma_1$ value used for blurring is equivalent to perform blur processing by a deviation value σΔ being a difference between the $\sigma_1$ value for blurring and the reference $\sigma_0$ value. As shown in the following equation (1-1), the difference deviation value σn, can be obtained by calculating a squared root of the $\sigma_1$ value for blurring and the reference $\sigma_0$ value. The difference deviation value σΔ may be approximated, instead of using the equation (1-1), by dividing the squared root of the maximum beam diameter $B_1$ at the shifted position Z' and the beam diameter $B_0$ of the reference primary electron beam in a just focused state by 2.35(=2√(2ln(2))).

The reference blurred image $I_1(x,y)$ can be obtained by convolving the reference pattern image $I_0(x,y)$ with a distribution function fa(x,y) in which the difference deviation value σΔ is set as σ. The reference blurred image $I_1$ (x,y) can be defined by the following equation (1-2).

$$\sigma\Delta=\sqrt{\sigma_1^2-\sigma_0^2} \qquad (1\text{-}1)$$

$$I_1(x,y)=\iint f_a(x',y')I_0(x-x', y-y')dxdy \qquad (1\text{-}2)$$

Figure 11A:
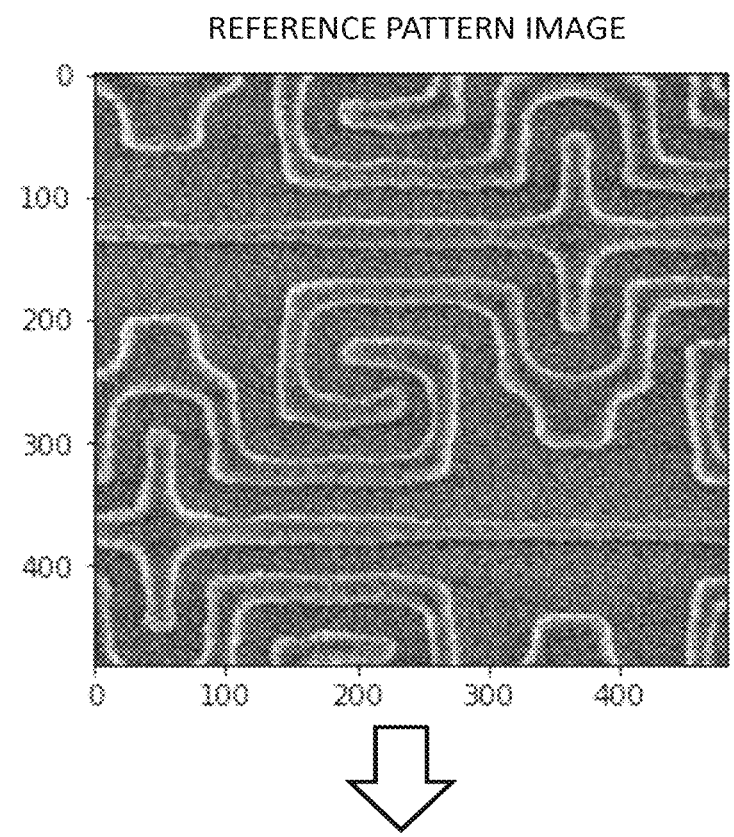
FIGS. 11A and 11B are examples of a reference pattern image and a reference blurred image according to the first embodiment.
Figure 11B:
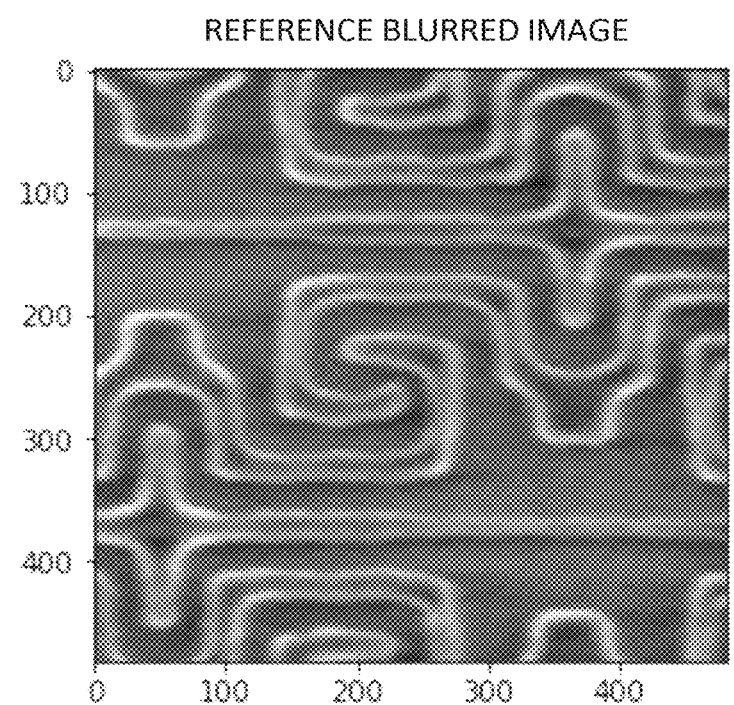

FIGS. 11A and 11B are examples of a reference pattern image and a reference blurred image according to the first embodiment. By performing, for the reference pattern image shown in FIG. 11A, blur processing corresponding to the $\sigma_1$ value for blurring, the reference blurred image shown in FIG. 11B can be generated. As known by comparing FIG. 11A with FIG. 11B, the reference blurred image shows the state of a blur condition used as a reference.

In the individual correction kernel coefficient calculation step (S120), the kernel coefficient calculation circuit 136 calculates individual correction kernels each of which individually adjusts a secondary electron image corresponding to each primary electron beam with respect to a reference pattern to be commensurate with a reference blurred image for which blur processing has been performed.

Figure 12A:
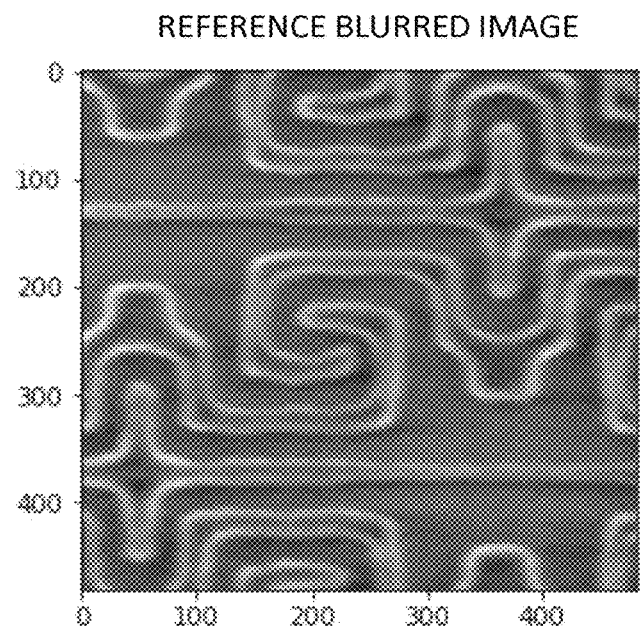
FIGS. 12A to 12C are images for explaining a relation among a reference blurred image, a measured image, and an individual correction kernel according to the first embodiment.
Figure 12B:
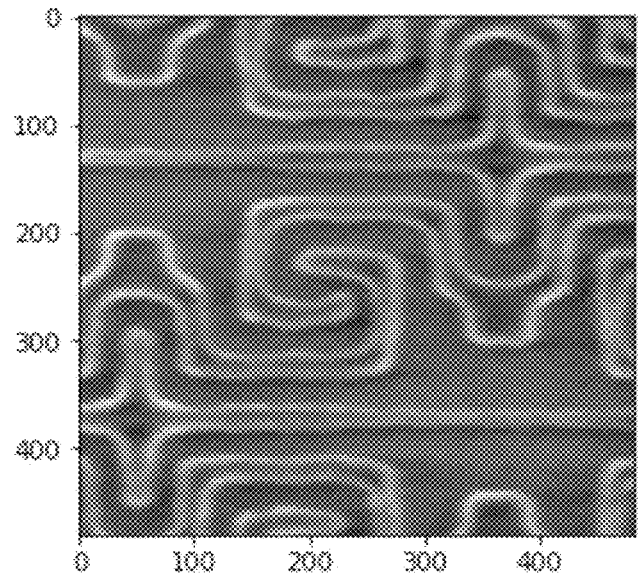
Figure 12C:
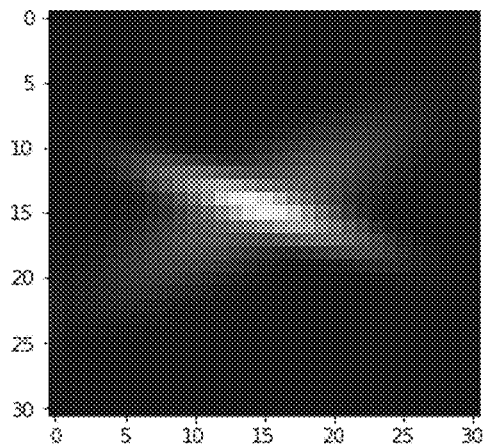

FIGS. 12A to 12C are images for explaining a relation among a reference blurred image, a measured image, and an individual correction kernel according to the first embodiment. Since the $\sigma_1$ value used for blurring has been obtained based on the maximum beam diameter $B_1$ at the shifted position Z', a secondary electron image of the reference pattern of each primary electron beam acquired in the state where the focus position of the reference primary electron beam has been shifted to the position Z' is individually adjusted to be commensurate with a reference blurred image. Specifically, an individual correction kernel is estimated which can adjust a secondary electron image (measured image) of the reference pattern of a primary electron beam shown in FIG. 12B to be commensurate with a reference blurred image shown in FIG. 12A by convolving the secondary electron image (measured image) of FIG. 12B with the individual correction kernel shown in FIG. 12C. For example, an individual correction kernel K(x,y) which renders the following result is obtained. Specifically, a value is obtained by convolving a secondary electron image (measured image) $I_2(x,y)$ of the reference pattern of each primary electron beam with the individual correction kernel K(x,y). Then, the value is subtracted from a reference blurred image $I_1(x,y)$, where the subtracted result is expressed by an absolute value. Then, the absolute value is squared and integrated to obtain a value M. The value M becomes the minimum due to the individual correction kernel K(x,y).

$$M = \iint |I_1(x', y') - \iint K(x',y') I_2(x-x', y-y') dx' dy'|^2 dx dy \quad (2)$$

Figures 13, 14:
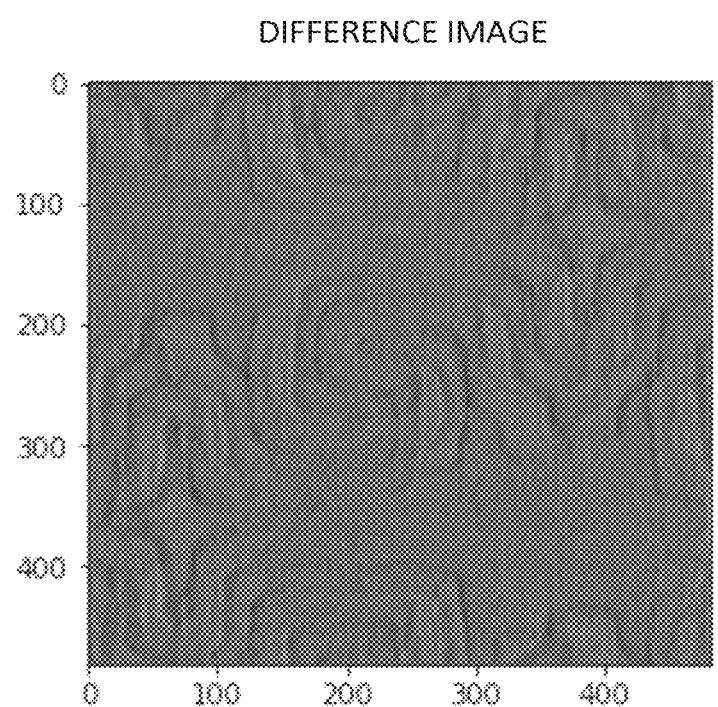
FIG. 13 is an example of an individual correction kernel according to the first embodiment.
FIG. 14 is an image of an example of a difference image according to the first embodiment.

FIG. 13 is an example of an individual correction kernel according to the first embodiment. For example, as shown in FIG. 13, the individual correction kernel K (x,y) can be defined by a matrix composed of 31×31 coefficients $a_{1,1}$ to $a_{31,31}$ as elements. For example, each of the elements $a_{1,1}$ to $a_{31,31}$ can be obtained by a least squares method. For example, each of the elements $a_{1,1}$ to $a_{31,31}$ can be obtained by solving simultaneous equations of 31×31 equations in which it is assumed that values of functions $\delta M/\delta a_{1,1}$ to $\delta M/\delta a_{31,31}$ which have been calculated by partially differentiating the value M shown in the equation (2) with respect to each element are individually zero. Such an individual correction kernel is estimated for each beam.

FIG. 14 is an image of an example of a difference image according to the first embodiment. FIG. 14 shows an example of a difference image obtained by subtracting, from the reference blurred image $I_1(x,y)$, an image obtained by convolving a secondary electron image (measured image) $I_2(x,y)$ of the reference pattern of a primary electron beam with an acquired individual correction kernel K(x,y). In the case of FIG. 14, the maximum grayscale of the difference image can be suppressed to two grayscales. Therefore, according to the first embodiment, even secondary electron images acquired using different beams can be close to images under the same condition as that of the reference blurred image by being convolved with respective individual correction kernels. Acquired individual correction kernels K(x,y) or coefficients (elements $a_{1,1}$ to $a_{31,31}$) of the individual correction kernels K(x,y) for respective primary electron beams are output to the correction circuit 113, and stored in the storage device 109 and/or the storage device (not shown).

After carrying out each above-described step before inspection processing, the inspection processing is executed using an actual substrate to be inspected.

Figure 15:
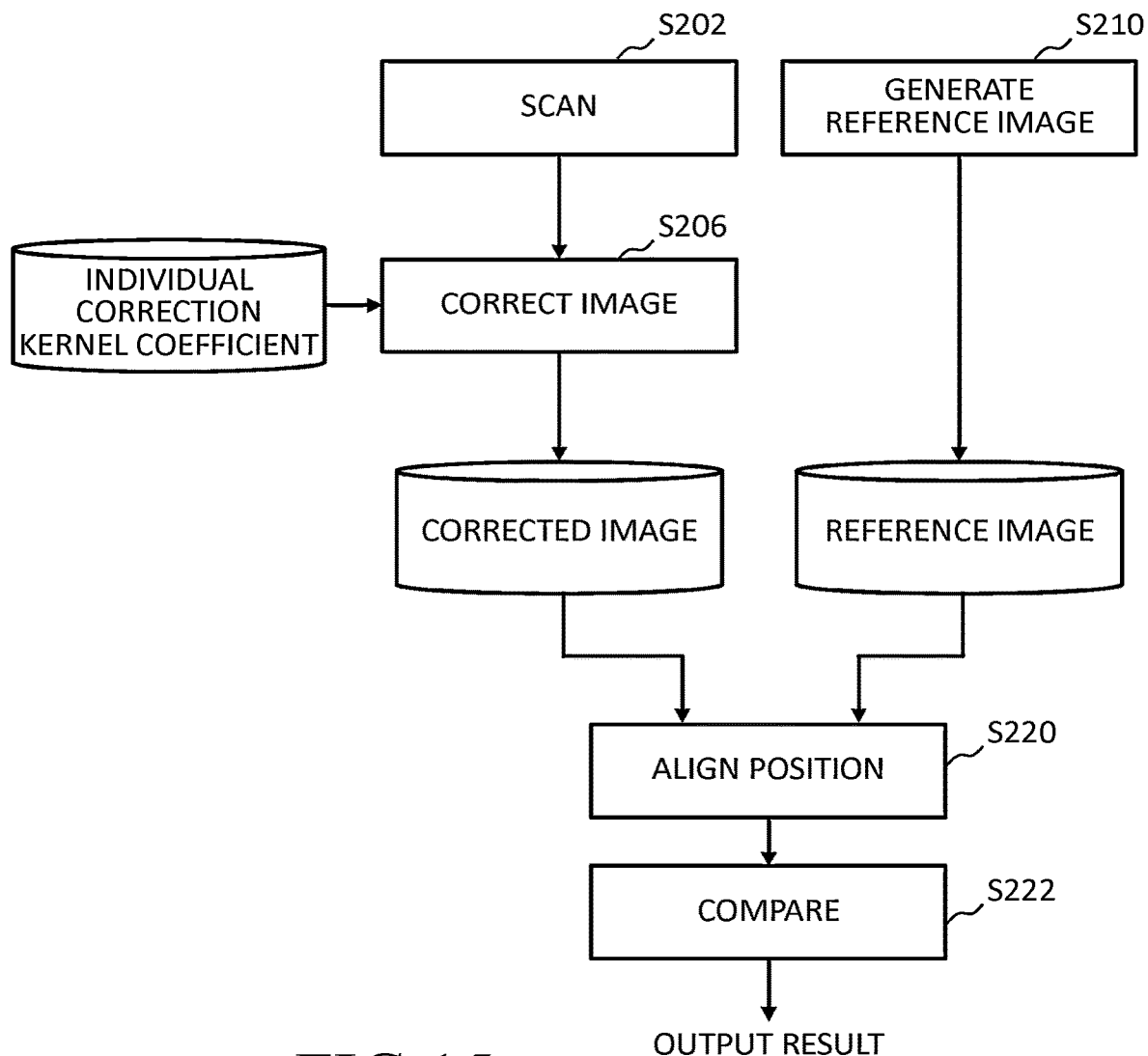
FIG. 15 is a flowchart showing the rest of the main steps of the inspection method according to the first embodiment.

FIG. 15 is a flowchart showing the rest of the main steps of the inspection method according to the first embodiment. In FIG. 15, the rest of the inspection method of the first embodiment executes, after performing each step shown in FIG. 5, a series of steps: a scanning step (S202), an image correction step (S206), a reference image generation step (S210), an alignment step (S220), and a comparison step (S222).

In the scanning step (S202), the image acquisition mechanism 150 acquires a secondary electron image corresponding to each primary electron beam by scanning the substrate 101 (target object), on which a pattern has been formed, with the multiple primary electron beams 20, and detecting the multiple secondary electron beams 300 emitted from the substrate 101. As described above, reflected electrons and secondary electrons may be projected on the multi-detector 222, or alternatively, after reflected electrons having been diffused (emitted) along the way, only remaining secondary electrons may be projected thereon. Specifically, it operates as follows: As described above, the image acquisition mechanism 150 scans the stripe region 32 in order to acquire an image of the stripe region 32. For acquiring an image, as described above, the multiple primary electron beams 20 are applied to the substrate 101 so that the multi-detector 222 may detect the multiple secondary electron beams 300, including reflected electrons, emitted from the substrate 101 due to the irradiation with the multiple primary electron beams 20. Detected data (measured image: secondary electron image: inspection image) on the secondary electron detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed in each stripe region 32. Then, the acquired measured image data is transmitted to the correction circuit 113, together with information on each position from the position circuit 107.

In the image correction step (S206), the correction circuit 113 (correction unit) corrects a secondary electron image corresponding to each primary electron beam acquired from the inspection substrate 101, using each corresponding individual correction kernel. Specifically, the correction circuit 113 corrects a secondary electron image by convolving a secondary electron image (measured image) of each primary electron beam with a correction kernel individually corresponding.

Figure 16:
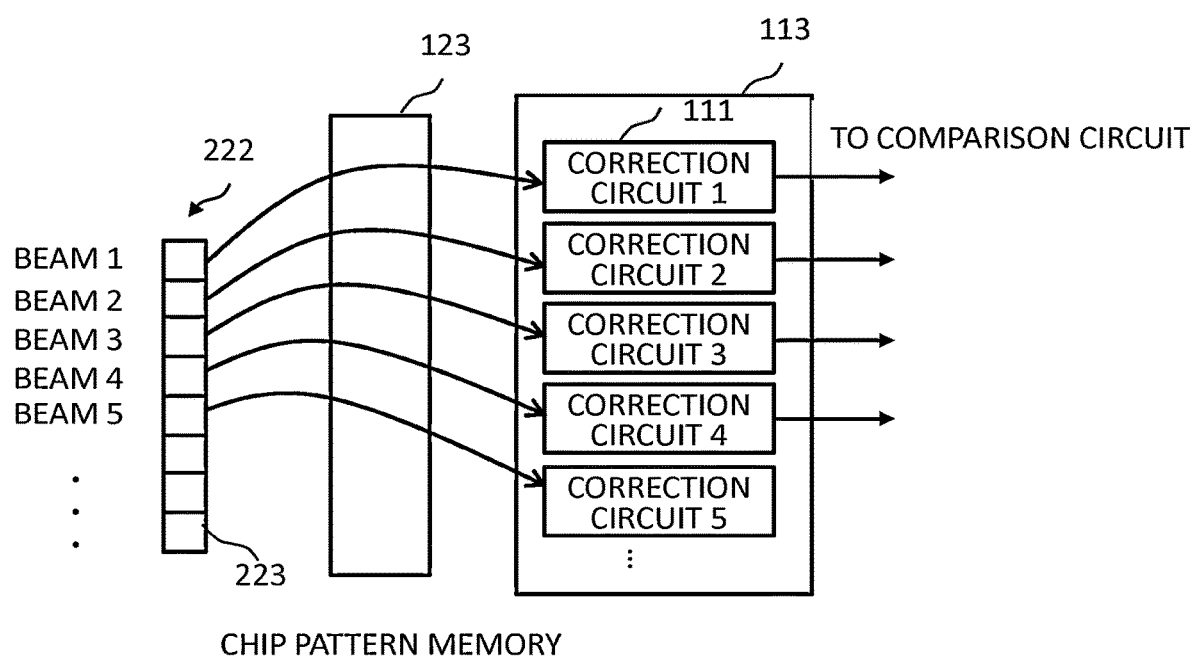
FIG. 16 is an illustration for explaining a method for correcting an image according to the first embodiment.

FIG. 16 illustrates a method for correcting an image according to the first embodiment. In FIG. 16, sub correction circuits 111 (1, 2, 3, 4, 5, . . . ) whose number is greater than or equal to the number of beams of the multiple primary electron beams 20 are disposed in the correction circuit 113. As described above, a plurality of detection sensors 223 are disposed in the multi-detector 222. Each detection sensor 223 is assigned to detect a secondary electron beam emitted by irradiation with a primary electron beam being different from the other primary electron beams of the multiple primary electron beams 20. Further, each sub correction circuit 111 in the correction circuit 113 is individually (uniquely) assigned to input image data from a detection sensor 223 being different from the other detection sensors 223 of a plurality of detection sensors 223 in the multi-detector 222. In other words, each sub correction circuit 111 in the correction circuit 113 is assigned to the sensor 223 for detecting a secondary electron beam emitted by irradiation with any one of the multiple primary electron beams 20. A coefficient (element) of the individual correction kernel K(x,y) for the associated primary electron beam is input, to be set, to each sub correction circuit 111. In the case of FIG. 16, an output of the detection sensor corresponding to the primary electron beam (beam 1) is input to the sub correction circuit 1. An output of the detection sensor corresponding to the primary electron beam (beam 2) is input to the sub correction circuit 2. An output of the detection sensor corresponding to the primary electron beam (beam 3) is input to the sub correction circuit 3. An output of the detection sensor corresponding to the primary electron beam (beam 4) is input to the sub correction circuit 4. An output of the detection sensor corresponding to the primary electron beam (beam 5) is input to the sub correction circuit 5. Each sub correction circuit performs smoothing processing by convolving a measured image of the sub-irradiation region 29 of the associated primary electron beam with the individual correction kernel K(x,y) for the associated primary electron beam. Thus, data of the measured image of each sub-irradiation region 29 for which the smoothing processing has been performed is output to the comparison circuit 108, together with information on position information indicated by the position circuit 107.

Figure 17:
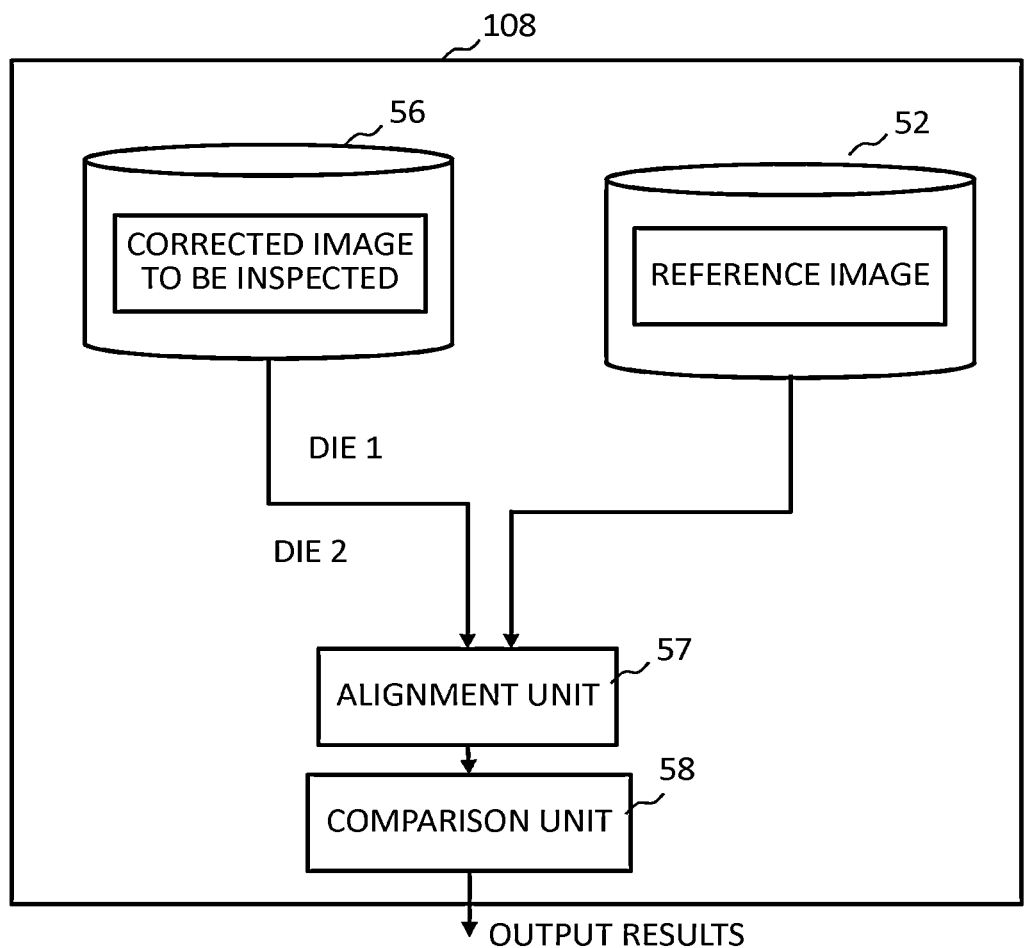
FIG. 17 is a configuration diagram showing an example of a configuration in a comparison circuit according to the first embodiment.

FIG. 17 is a configuration diagram showing an example of a configuration in a comparison circuit according to the first embodiment. In FIG. 17, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry. As the processing circuitry, for example, an electric circuit, computer, processor, circuit board, quantum circuit, semiconductor device, or the like can be used. Further, common processing circuitry (the same processing circuitry), or different processing circuitry (separate processing circuitry) may be used for each of the "units". Input data required in the alignment unit 57 and the comparison unit 58, and calculated results are stored in a memory (not shown) or in the memory 118 each time.

Figure 18:
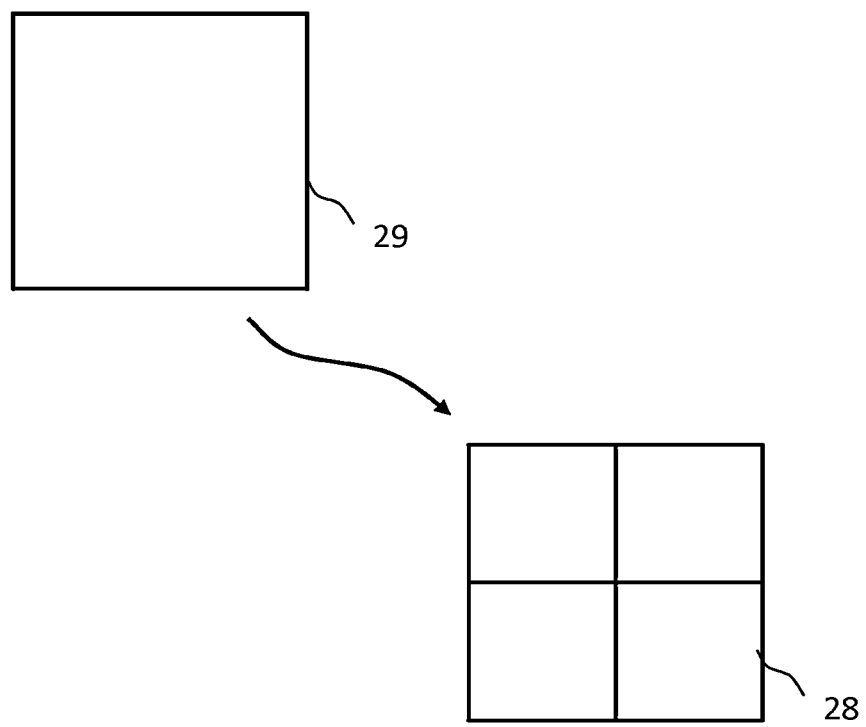
FIG. 18 is an illustration of an example of an inspection unit region according to the first embodiment.

FIG. 18 is an illustration of an example of an inspection unit region according to the first embodiment. In the comparison circuit 108, an inspection image configured by at least a portion of a secondary electron image having been corrected and a reference image are compared. A secondary electron image of each frame region 28, for example, is used as the inspection image. For example, the sub irradiation region 29 is divided into the four frame regions 28. As the frame region 28, a region of 512×512 pixels is used, for example. Specifically, it operates as follows:

In the reference image generation step (S210), the reference image generation circuit 112 generates a reference image corresponding to a measured image of each frame region, based on design data serving as a basis of a plurality of figure patterns formed on the substrate 101. Specifically, it operates as follows: First, design pattern data is read from the storage device 109 through the control computer 110, and each figure pattern defined by the read design pattern data is converted into image data of binary or multiple values.

As described above, basic figures defined by the design pattern data are, for example, rectangles (including squares) and triangles. For example, there is stored figure data defining the shape, size, position, and the like of each pattern figure by using information, such as coordinates (x,y) of the reference position of the figure, lengths of sides of the figure, and a figure code serving as an identifier for identifying the figure type such as rectangles and triangles.

When design pattern data used as the figure data is input to the reference image generation circuit 112, the data is developed into data for each figure. Then, the figure code, the figure dimensions, and others indicating the figure shape of the figure data are interpreted. Then, it is developed into design pattern image data of binary or multiple values as a pattern to be arranged in squares in units of grids of predetermined quantization dimensions, and then is output. In other words, the reference image generation circuit 112 reads design data, calculates the occupancy of a figure in the design pattern, for each square obtained by virtually dividing the inspection region into squares in units of predetermined dimensions, and outputs n-bit occupancy data. For example, it is preferable to set one square as one pixel. Assuming that one pixel has a resolution of $1/2^8 (=1/256)$, the occupancy rate in each pixel is calculated by allocating sub-regions, each having 1/256 resolution, which correspond to the region of a figure arranged in the pixel. Then, it is generated as occupancy rate data of 8 bits. Such squares (inspection pixels) may be commensurate with pixels of measured data.

Next, the reference image generation circuit 112 performs filtering processing on design image data of a design pattern which is image data of a figure, using a filter function F where a calculated coefficient is used. Thereby, it becomes possible to match the design image data being design side image data, whose image intensity (gray scale level) is represented by digital values, with image generation characteristics obtained by irradiation with a representative beam (e.g., center beam) of the multiple primary electron beams 20. The generated image data of a reference image is output to the comparison circuit 108.

The corrected measured image (corrected image to be inspected) having been input to the comparison circuit 108 is stored in the storage device 56. The reference image having been input to the comparison circuit 108 is stored in the storage device 52.

In the alignment step (S220), the alignment unit 57 reads, for each frame region, a corrected secondary electron image and a corresponding reference image from the storage device, and provides alignment between both the images, based on units of sub-pixels smaller than units of pixels. For example, the alignment can be performed using a least-squares method. Preferably, the pixel size is set to be, for example, a region size being approximately the same as each beam size of the multiple primary electron beams 20.

In the comparison step (S222), the comparison unit 58 compares the frame image (inspection image) with the reference image. The comparison unit 58 compares them, for each pixel, based on predetermined determination conditions in order to determine whether there is a defect such as a shape defect. For example, if a difference in gray scale level for each pixel is larger than a determination threshold Th, it is determined that there is a defect. Then, the comparison result may be output to the storage device 109, the monitor 117, or the memory 118, or alternatively, output from the printer 119.

In the examples described above, the die-to-database inspection is performed. However, it is not limited thereto. The die-to-die inspection may be conducted. Now, the case of performing the die-to-die inspection will be described.

In the alignment step (S220), the alignment unit 57 reads a frame image (corrected image to be inspected) of the die 1 and a frame image (corrected image to be inspected) of the die 2 on which the same pattern as that of the die 1 is formed, and provides alignment between both the images, based on units of sub-pixels smaller than units of pixels. For example, the alignment can be performed using a least-squares method.

In the comparison step (S222), the comparison unit 58 compares the frame image (corrected image to be inspected) of the die 1 with the frame image (corrected image to be inspected) of the die 2, where one of the frame images is used as a reference image. The comparison unit 58 compares them, for each pixel, based on predetermined determination conditions in order to determine whether there is a defect such as a shape defect. For example, if a difference in gray scale level for each pixel is larger than the determination threshold Th, it is determined that there is a defect. Then, the comparison result may be output to the storage device 109, the monitor 117, or the memory 118, or alternatively, output from the printer 119.

As described above, according to the first embodiment, even inspection images acquired with different beams can be adjusted to be close to images acquired under the same conditions. Thus, it is possible to perform inspection between inspection images acquired with different beams.

In the above description, a series of "... circuits" includes processing circuitry. The processing circuitry includes an electric circuit, a computer, a processor, a circuit board, a quantum circuit, a semiconductor device, or the like. Each "... circuit" may use common processing circuitry (the same processing circuitry), or different processing circuitry (separate processing circuitry). A program for causing a processor, etc. to execute processing may be stored in a recording medium, such as a magnetic disk drive, magnetic tape drive, FD, or ROM (Read Only Memory). For example, the position circuit 107, the comparison circuit 108, the reference image generation circuit 112, the correction circuit 113, the stage control circuit 114, the lens control circuit 124, the blanking control circuit 126, the deflection control circuit 128, the blur index σ estimation circuit 130, the blur index σ setting circuit 132, the reference blurred image generation circuit 134, the kernel coefficient calculation circuit 136, and the reference beam selection circuit 138 may be configured by at least one processing circuit described above.

Embodiments have been explained referring to specific examples as described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by irradiation with a primary electron beam from each of a plurality of irradiation sources.

While the apparatus configuration, control method, and others not directly necessary for explaining the present invention are not described, some or all of them can be appropriately selected and used on a case-by-case basis when needed.

Further, any pattern inspection apparatus and pattern inspection method that include elements of the present invention and that can be appropriately design-modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern inspection apparatus comprising:
a secondary electron image acquisition mechanism configured to include a deflector which deflects multiple primary electron beams and a detector which detects multiple secondary electron beams, and to acquire a secondary electron image corresponding to each primary electron beam of the multiple primary electron beams by scanning a surface of a target object, on which a pattern has been formed, with the multiple primary electron beams by using the deflector, and detecting the multiple secondary electron beams emitted from the surface of the target object by using the detector;
a storage device configured to store individual correction kernels each of which is generated for individually adjusting a secondary electron image corresponding to the each primary electron beam with respect to a reference pattern to be commensurate with a reference blurred image;
a correction circuit configured to correct, by correspondingly using the individual correction kernel, the secondary electron image corresponding to the each primary electron beam acquired from the target object to be inspected;
a comparison circuit configured to compare an inspection image configured by at least a portion of the secondary electron image having been corrected and a reference image; and
a reference blurred image generation circuit configured to generate the reference blurred image by performing blur processing corresponding to an index value for blurring, with respect to the secondary electron image of the reference pattern acquired in a state where a focus position of a reference primary electron beam selected from the multiple primary electron beams is set on the surface of the target object.

2. The apparatus according to claim 1 further comprising:
a determination circuit configured to determine the index value for blurring, based on a blur index which is estimated from at least one of secondary electron images of an evaluation pattern of respective primary electron beams of the multiple primary electron beams, the secondary electron images of the evaluation pattern of the respective primary electron beams being acquired at a position obtained by shifting the focus position of the reference primary electron beam, selected among the multiple primary electron beams, from the surface of the target object.

3. The apparatus according to claim 2, wherein the index value for blurring is determined based on a secondary electron image of an evaluation pattern of a primary electron beam having a maximum beam diameter, in the secondary electron images of the evaluation pattern of the respective primary electron beams.

4. The apparatus according to claim 2, further comprising:
a blur index estimation circuit configured to estimate a blur index individually based on the secondary electron images of the evaluation pattern of the respective primary electron beams, where the secondary electron images of the evaluation pattern of the respective primary electron beams are acquired at each of positions obtained by variably shifting the focus position of the reference primary electron beam; and
a distribution generation circuit configured to generate a distribution of the blur index of the each primary electron beam, where the blur index of the each primary electron beam is estimated at each of the positions obtained by shifting the focus position of the reference primary electron beam,
wherein, referring to the distribution of the blur index of the each primary electron beam, the index value for blurring is determined based on a maximum value of the blur index of the each primary electron beam at a shifted position where the maximum value of the blur index is minimum compared with other maximum values of the blur index value at other shifted positions.

5. The apparatus according to claim 3, wherein a beam diameter of a primary electron beam, expressed by a full width at half maximum, corresponding to the index value for blurring is one of ½ and less than ½ of a defect size.

6. A pattern inspection method comprising:
acquiring a secondary electron image corresponding to each primary electron beam of multiple primary electron beams by scanning a surface of a target object, on which a pattern has been formed, with the multiple primary electron beams, and detecting multiple secondary electron beams emitted from the surface of target object;

correcting the secondary electron image corresponding to the each primary electron beam acquired from the target object to be inspected, by reading from a storage device an individual correction kernel, which correspondingly adjusts each secondary electron image corresponding to the each primary electron beam with respect to a reference pattern to be commensurate with a reference blurred image, to perform the correcting by correspondingly using the individual correction kernel;

comparing an inspection image configured by at least a portion of the secondary electron image having been corrected and a reference image so as to output a compared result; and generating the reference blurred image by performing blur processing corresponding to an index value for blurring, with respect to the secondary electron image of the reference pattern acquired in a state where a focus position of a reference primary electron beam selected from the multiple primary electron beams is set on the surface of the target object.

7. The method according to claim 6 further comprising: determining the index value for blurring, based on a blur index which is estimated from at least one of secondary electron images of evaluation pattern of respective primary electron beams of the multiple primary electron beams, each acquired at a position obtained by shifting the focus position of the reference primary electron beam, selected among the multiple primary electron beams, from the surface of the target object.

8. The method according to claim 7, wherein the index value for blurring is determined based on a secondary electron image of an evaluation pattern of a primary electron beam having a maximum beam diameter, in the secondary electron images of the evaluation patterns of the respective primary electron beams.

9. The method according to claim 7, further comprising:
estimating a blur index individually based on the secondary electron images of the evaluation pattern of the respective primary electron beams, where the secondary electron images of the evaluation pattern of the respective primary electron beams are acquired at each of positions obtained by variably shifting the focus position of the reference primary electron beam; and generating a distribution of the blur index of the each primary electron beam, which is estimated at the each of the positions obtained by shifting the focus position of the reference primary electron beam, wherein, referring to the distribution of the blur index value of the each primary electron beam, the blur index value for blurring is determined based on a maximum value of the blur index value of the each primary electron beam at a shifted position where the maximum value of the blur index value is minimum compared with other maximum values of the blur index value at other shifted positions.

10. The method according to claim 8, wherein a beam diameter of a primary electron beam, expressed by a full width at half maximum, corresponding to the index value for blurring is one of ½ and less than ½ of a defect size.

* * * * *